United States Patent [19]

Go et al.

[11] Patent Number: 5,170,453
[45] Date of Patent: Dec. 8, 1992

[54] OPTICAL MODULE

[75] Inventors: Hisao Go; Hidenori Takahashi, both of Kanagawa, Japan

[73] Assignee: Sumitomo Electric Industries, Ltd., Osaka, Japan

[21] Appl. No.: 573,583

[22] Filed: Aug. 28, 1990

[51] Int. Cl.⁵ .................... G02B 6/00; G02B 6/36
[52] U.S. Cl. ................................................ 385/70
[58] Field of Search .................... 350/96.20-96.22

[56] References Cited

U.S. PATENT DOCUMENTS

| | | | |
|---|---|---|---|
| 4,136,357 | 1/1979 | Frederiksen | 357/72 |
| 4,188,708 | 2/1980 | Frederiksen | 385/14 X |
| 4,730,198 | 3/1988 | Brown et al. | 350/96.20 |
| 4,744,626 | 5/1988 | Mery | 350/96.20 |
| 4,803,361 | 2/1989 | Aiki et al. | 350/96.20 |
| 4,820,013 | 4/1989 | Fuse | 350/96.20 |
| 4,827,118 | 5/1989 | Shibata et al. | 250/211 J |
| 4,834,491 | 5/1989 | Aoki et al. | 350/96.20 |
| 4,868,640 | 9/1989 | Shine | 357/75 |
| 4,937,654 | 6/1990 | Hirabayashi | 357/70 |
| 4,961,107 | 10/1990 | Geist et al. | 357/81 |
| 4,977,442 | 12/1990 | Suzuki et al. | 357/70 |

FOREIGN PATENT DOCUMENTS

| | | |
|---|---|---|
| 0183857 | 6/1986 | European Pat. Off. . |
| 0273364 | 7/1988 | European Pat. Off. . |
| 58-4952 | 1/1983 | Japan . |
| 59-119774 | 7/1984 | Japan . |
| 59-205775 | 11/1984 | Japan . |
| 0205775 | 11/1984 | Japan . |
| WO88/10441 | 12/1988 | PCT Int'l Appl. . |
| WO90/00753 | 1/1990 | PCT Int'l Appl. . |
| WO90/04799 | 5/1990 | PCT Int'l Appl. . |
| 630760 | 6/1982 | Switzerland . |
| 2126795 | 3/1984 | United Kingdom . |

Primary Examiner—Akm E. Ullah
Attorney, Agent, or Firm—Cushman, Darby & Cushman

[57] ABSTRACT

An optical module comprises an optical connector, to one end of which one end of an optical fiber is connected; an optically operating element secured to the optical connector, the optically operating element being optically coupled to the optical fiber; electronic circuit elements forming an electronic circuit connected to the optically operating element; a substrate bearing the electronic circuit elements; lead pins consisting of inner and outer leads, the inner leads being connected to the electronic circuit; and a molded resin member holding as one unit the optical connector, the optically operating element, the electronic circuit elements, the substrate and the lead pins except the one end of the optical connector and the outer leads of the lead pins. The optical module is manufactured using a lead fram comprising a plurality of lead parts which are formed into the lead pins later; a frame for supporting the lead parts; a substrate forming part supported by a few of the lead parts; and a holding member for holding the optical connector.

11 Claims, 6 Drawing Sheets

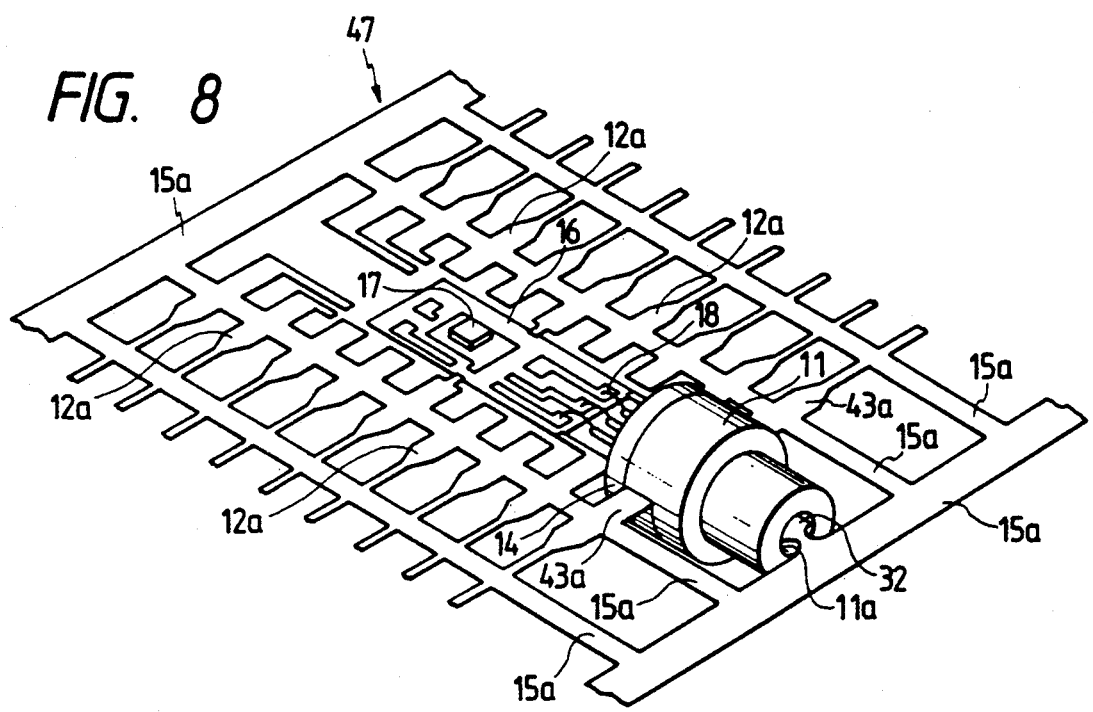
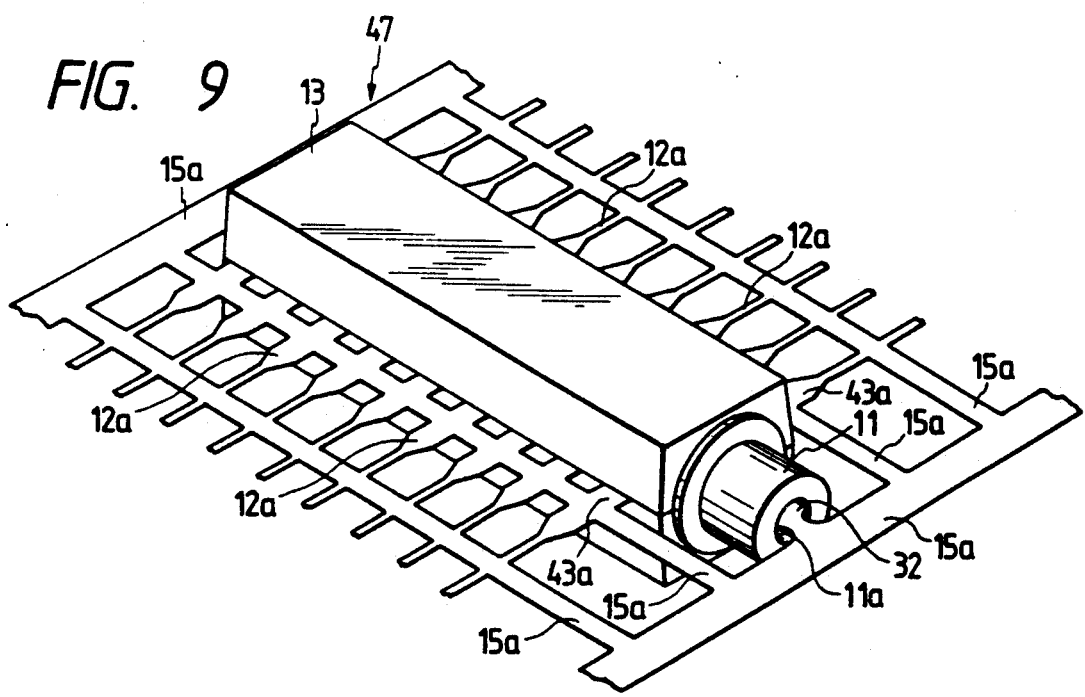

OPTICAL MODULE

RELATED APPLICATIONS

This application is directed to subject matter that is generally related to the subject matter disclosed in the following U.S. applications:

1) U.S. application Ser. No. 07/667,301;
2) U.S. application Ser. No. 07/670,421;
3) U.S. application Ser. No. 07/588,990.

BACKGROUND OF THE INVENTION

This invention relates to an optical module used in optical communication systems such as a data link and optical LAN employing light as data transmitting medium, and to a lead frame used to manufacture the optical module.

Examples of an optical module of this type are a signal transmitting module employing a light emitting element such as a semiconductor laser as an optically operating element, and a signal receiving module employing a light receiving element such as a pin photodiode as an optically operating element.

A conventional optical module is as shown in FIG. 1. In the optical module, an optical connector 1 is engaged with a ferrule (not shown) secured to the end of an optical fiber (not shown), and an optically operating element 2 (such as a light emitting element or a light receiving element) is fixedly secured to the optical connector 1 with adhesive for instance, with the optical axis adjusted. The optical connector 1 with the optically operating element 2 is fixedly secured to a ceramic package 3 with adhesive for instance. In addition to the optical connector 1, a substrate 6 is secured to the ceramic package 3, which bears an electronic circuit section including electronic components such as bear chip ICs 5. The bear chip ICs 5 etc. on the substrate 6 together with wires connected to the printed circuit on the substrate 6 are sealingly covered with a lid 7. In addition, the ceramic package 3 has lead pins 8 comprising inner leads 8a and outer leads 8b which are extended inside and outside of the ceramic package 3, respectively. The inner leads 8a are electrically connected to the electronic circuit section on the substrate 6, for instance, by wire bonding, and the electronic circuit section is also electrically connected to the terminals of the optically operating element 2, for instance, by wire bonding. Under this condition, a cover 10 is fixedly secured to the ceramic package 3. Thus, the optical module has been formed.

The conventional optical module thus formed is disadvantageous in the following points: Being constructed as described above, the optical module is large in the number of components. The many components are assembled one after another into the optical module. Therefore, the assembling work is intricate, requiring a number of manufacturing steps. In addition, the optical module uses an expensive material such as ceramic material. Thus, it is difficult to reduce the manufacturing cost of the optical module, and to produce it on a large scale.

On the other hand, there has been a strong demand for provision of the optical module at low cost in the field of optical communication system or the like.

SUMMARY OF THE INVENTION

Accordingly, an object of this invention is to provide an optical module which can be manufactured on a large scale and at low cost.

Another object of the invention is to provide an optical module high in reliability and excellent in durability.

The foregoing objects and other objects of the invention have been achieved by the provision of an optical module in which, according to the invention, a molded resin member is formed to hold as one unit the components of the optical modules, namely, an optical connector, an optically operating element, electronic circuit elements, a substrate, and lead pins.

In order to manufacture the optical module, a lead frame is provided which, according to the invention, includes holding members adapted to hold the optical connector.

The above-described structure of the optical module contributes to simplification of the assembling of the latter. Furthermore, the lead frame holds the optical connector. Therefore, when the lead frame is moved after the optically operating element secured to the optical connector has been connected to the electronic circuit section on the substrate with wires, the difficulty is prevented that the optical connector oscillates with respect to the lead frame, to break or disconnect the wires.

BRIEF DESCRIPTION OF THE DRAWINGS

FIG. 8 is a perspective view showing another example of the module manufactured by using another lead frame according to the invention, for which a transfer molding operation is not carried out yet;

FIG. 9 is a perspective view showing the optical module of the invention for which the transfer molding operation has been carried out;

DETAILED DESCRIPTION OF THE PREFERRED EMBODIMENTS

Preferred embodiments of this invention will be described with reference to FIGS. 2 through 12.

Figure 1:
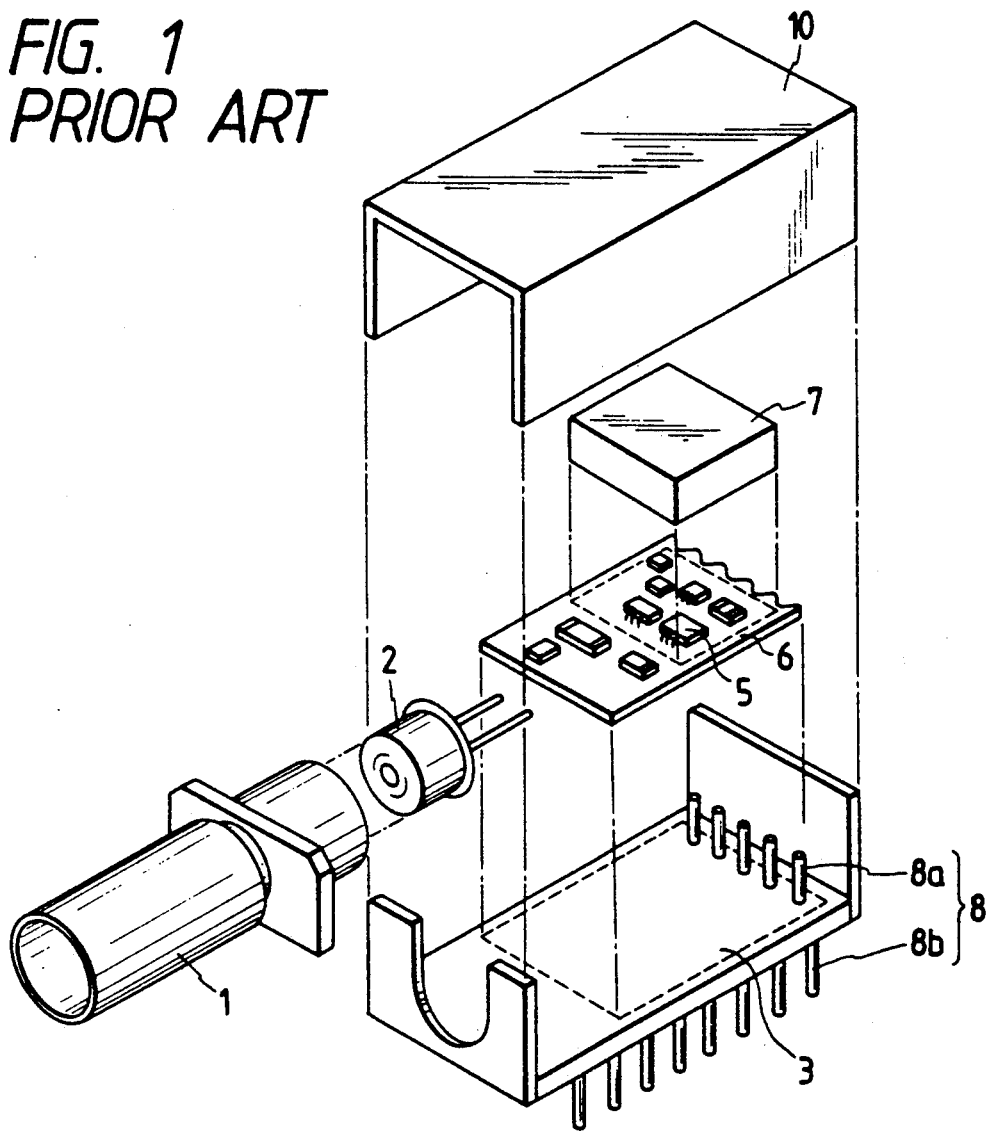
FIG. 1 is an exploded view showing a conventional optical module.
Figure 2:
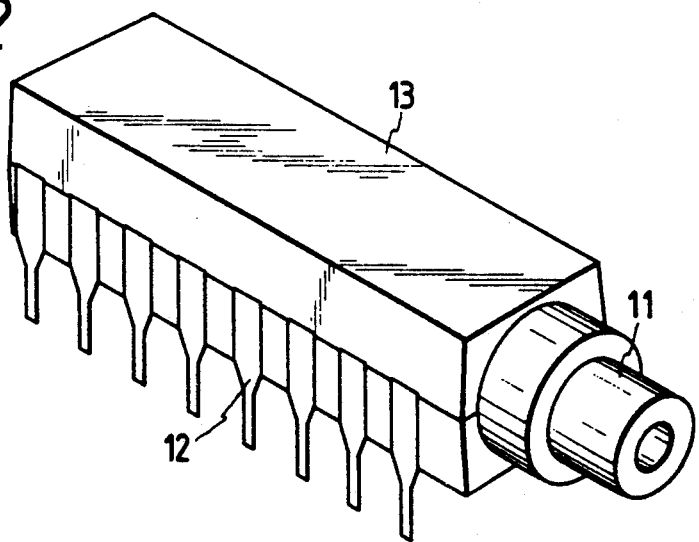
FIG. 2 is a perspective view showing one example of an optical module according to this invention.

FIG. 2 shows a first example of an optical module according to the invention. As is apparent from FIG. 2, the components of the optical module such as an optical connector 11 and lead pins 12 are combined into one unit with a molded resin member 13. The components (not shown in FIG. 2) other than the optical connector 11 and the lead pins 12; namely, an optically operating element secured to the optical connector 11, an electronic circuit electrically connected to the optical operating element and the lead pins 12, and a substrate bearing the electronic circuit are held in the molded resin member 13.

The structure of the optical module and a method of manufacturing the same according to the invention will be described with reference to FIGS. 3 and 4.

Figure 3:
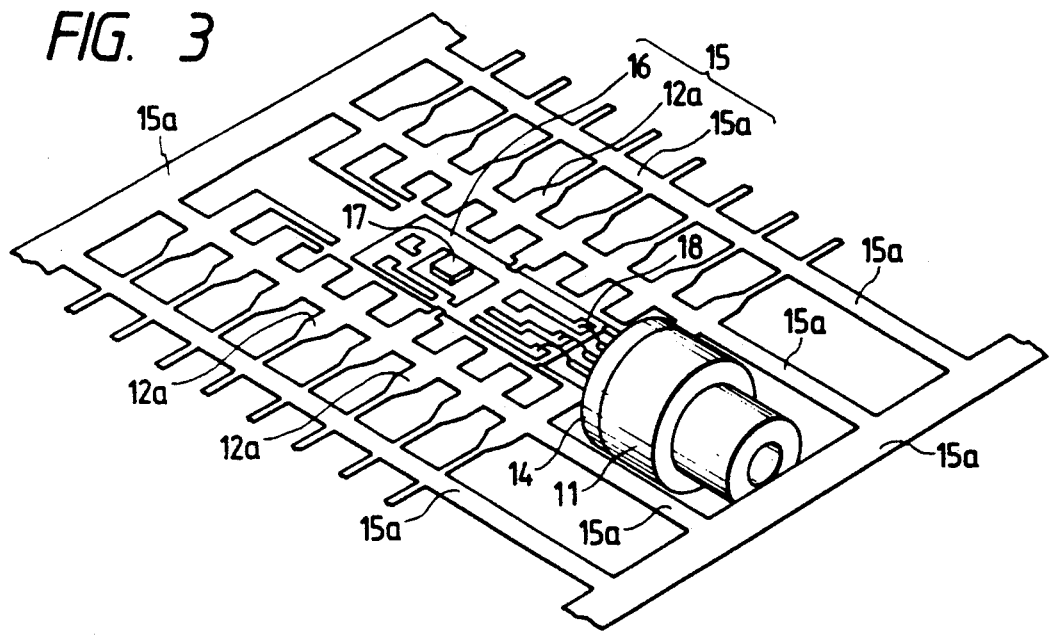
FIG. 3 is a perspective view showing the optical module of the invention for which a transfer molding operation is not carried out yet.

FIG. 3 shows the components such as the optical connector 11 to form the optical module which are not held with the molded resin member 13 yet. FIG. 4 shows those components held as one unit with the molded resin member 13.

As shown in FIG. 3, first the optically operating element 14 such as a laser diode or photo diode is fixedly secured to the optical connector 11, for instance, by welding with the optical axis adjusted.

Thereafter, a lead frame 15 is used. The lead frame 15 includes: a plurality of lead parts 12a which are formed into the lead pins 12 later; a frame part 15a supporting the lead parts 12a; and a substrate forming part 16 supported by a few of the lead parts 12a. The entire of the lead frame 15 can be obtained at the same time by etching a thin plate of Fe-42% Ni alloy (42 alloy) or copper about 0.25 mm in thickness or by blanking it on a press. Alternatively, the lead frame 15 may be formed as follows: The substrate forming part 16, and the remaining parts are formed separately. Then, the substrate forming part 16 is connected to the ends of the few lead parts 12a, for instance, by welding.

An insulating film layer of alumina ($Al_2O_3$) or the like is formed on the surface of the substrate forming part 16, and an electrically conductive wiring pattern including bonding pads is formed of aluminum on the insulating film layer. Electronic circuit components such as bear chip ICs 17 are fixedly mounted on the substrate forming part 16 on which the wiring pattern has been formed as described above, and are then connected to the wiring pattern, for instance, by wire bonding, to form an electronic circuit. As is apparent from the above description, the substrate forming part 16 serves as means for supporting the electronic circuit including the bear chip ICs 17 etc.

The inner portions of the lead parts 12a other than those used to support the substrate forming part 16, which become the inner leads, are connected to the electronic circuit by wire bonding.

The electronic circuit is electrically connected to the terminals of the optically operating element 14 with wires 18.

Figure 4:
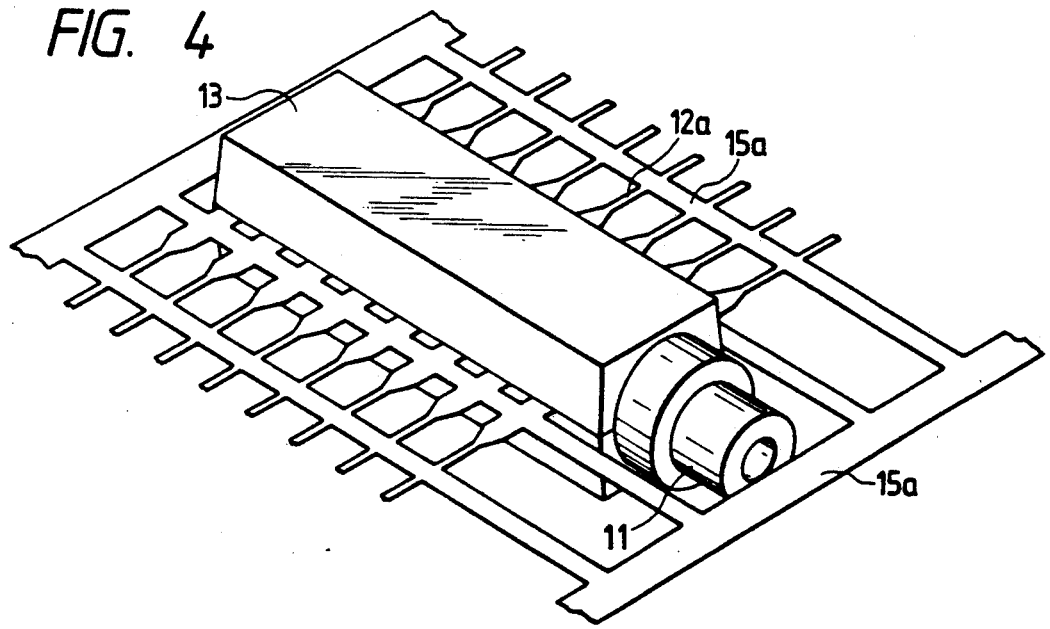
FIG. 4 is a perspective view showing the optical module of the invention for which the transfer molding operation has been carried out.

These components thus connected are set in a mold die (not shown) for transfer molding as they are, and fluid resin is injected thereinto to form the molded resin member 13 as shown in FIG. 4. That is, the components are held as one unit with the molded resin member, with the end portion of the optical connector 11 exposed, into which the optical fiber is inserted, and with the outer portions of the lead parts 12a exposed, which become the outer leads.

The molded resin member 13 formed by transfer molding is excellent in sealing characteristic similarly as in that of a general IC, because it is molded under high pressure. Thus, the provision of the molded resin member eliminates the lid and the cover which are employed in the conventional optical module to seal bear chip ICs etc. Furthermore, when compared with the conventional optical module with the ceramic package, the optical module of the invention can be packaged with the resin low in cost. More specifically, in the optical module of the invention, the packaging cost can be reduced to several tens of yen, which is less than 1/10 of the conventional packing cost.

After formation of the molded resin member 13, the unnecessary portions of the lead frame 15 are cut off by the press, and the remaining lead parts are bent into the lead pins 12. Thus, the optical module as shown in FIG. 2 has been manufactured. As was described above, the lead pins 12 are formed by bending the lead parts 12a which remain after the unnecessary portions of the lead frame 15 have been cut off in succession to the formation of the molded resin member 13. This eliminates the intricate step of providing the lead pins on the ceramic package in the manufacture of the conventional optical module.

In the above-described optical module manufacturing method, the optical connector is connected to the substrate with the wires only until the transfer molding operation is carried out. Therefore, when the assembly is shifted from the wire bonding step to the transfer molding step, the wires may be broken or disconnected. Therefore, the assembly must be moved with great care.

In view of the foregoing, an optical module manufacturing lead frame according to the invention will be described, with which the wires will not be broken, and accordingly the productivity can be improved as much.

Figure 5:
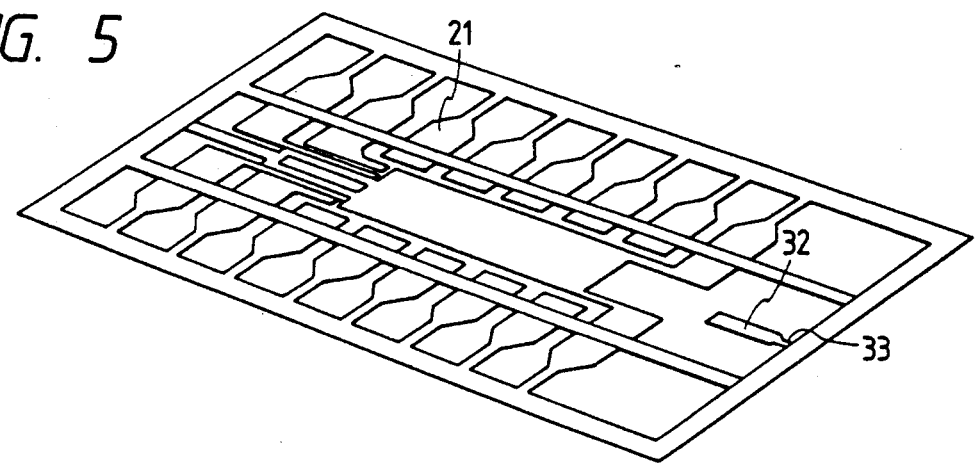
FIG. 5 is a perspective view showing a lead frame for manufacturing the optical module according to the invention.
Figure 6:
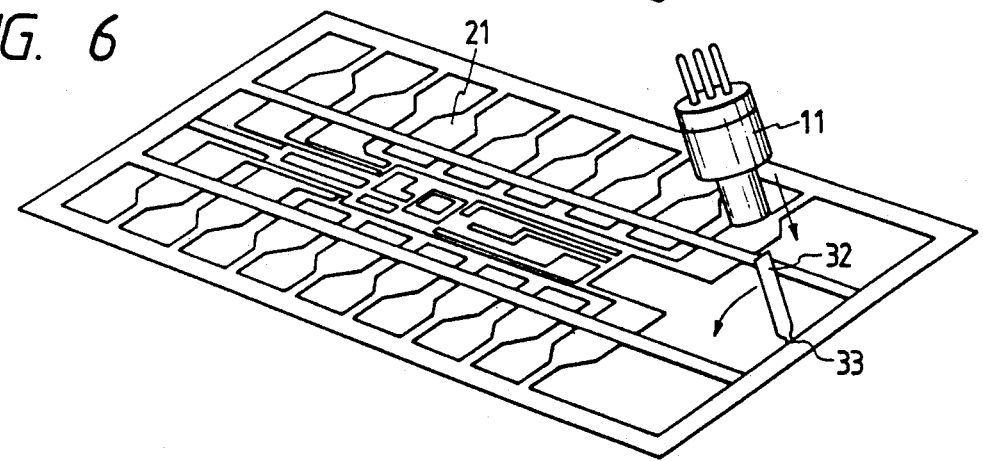
FIG. 6 is a perspective view showing the lead frame to which its relevant components have been coupled.
Figure 7:
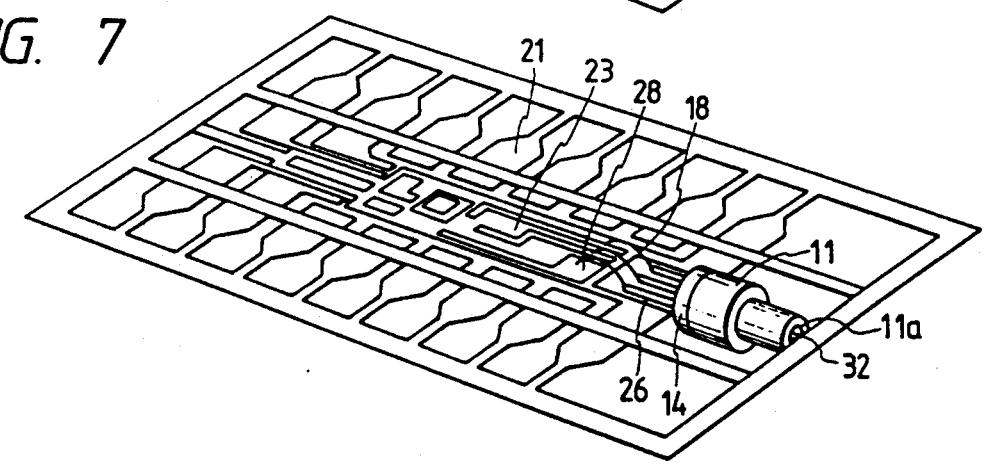
FIG. 7 is a perspective view showing a method of coupling an optical connector to the lead frame.

One example of the optical module manufacturing lead frame is as shown in FIGS. 5 through 7. FIG. 5 is a perspective view of the lead frame, FIG. 6 is a perspective view showing the lead frame and components mounted on it, and FIG. 7 shows how to connect an optical connector to the lead frame shown in FIG. 5.

The lead frame 21 shown in these figures is made of 42 alloy and is 0.25 mm in thickness. The lead frame 21 has a holding member 32 at its runner part on the right side. The width of the holding member 32 is slightly smaller than the inside diameter of the ferrule insertion hole 11a of the optical connector 11 connected to the lead frame 21, so that the holding member 32 is inserted into the ferrule insertion hole 11a to hold the optical connector 11. The holding member 32 is formed together with the lead frame 21 by etching or blanking the metal plate.

The components are connected to the lead frame 21 as follows: First, a substrate 23 is connected to the lead frame 21 by spot welding, and then the electronic components (ICs, chip resistors, chip capacitors, etc.) are mounted on the substrate 23. The substrate 23 is made of 42 alloy, and an insulating layer is formed on the surface of the substrate by coating. An Al circuit pattern is formed on the insulating layer thus formed. After the electronic components have been mounted on the substrate 23, the holding member 32 is bent upwardly as shown in FIG. 6 and then inserted into the ferrule insertion hole 11a of the optical connector 11. Under this condition, the holding member 32 is bent downwardly to its original position. In order to facilitate the bending of the holding member 32, cuts 33 are formed in the base portion of the holding member 32 which is on the runner side.

Thereafter, the terminals 26 of the optically operating element 14 are electrically connected to pads 28 of the substrate 23 with wires 18.

After the components have been connected as described above, the resultant assembly is placed in a mold die, and a package is formed by transfer molding. Thereafter, the unnecessary portions (including the holding member 32) of the lead frame 21 are cut off, and the remaining lead pins are bent. Thus, the aimed optical module has been manufactured.

As is apparent from the above description, according to the optical module manufacturing lead frame 21 of the invention, the optical connector 11 and the lead frame 21 are mechanically held by the holding member 32. Therefore, the difficulty is completely eliminated that the wires connected in the wire bonding step are broken before the molding step is accomplished. The holding member can be readily cut off after the molding step, and therefore the provision of the holding member scarcely increases the manufacturing cost.

In the above-described embodiment, the lead frame 21 is of 42 alloy; however, the invention is not limited thereto or thereby. For instance, the lead frame 21 may be made of copper. Furthermore, in the above-described embodiment, the holding member 32 is so shaped as to be inserted into the ferrule insertion hole 11a of the optical connector 11; however, the invention is not limited thereto or thereby. That is, the holding member may be so shaped that it holds the optical connector 11 from both sides.

An optical module manufacturing method using another example of the optical module manufacturing lead frame according to the invention will be described with reference to FIGS. 8 through 10.

FIG. 8 shows optical module forming components such as an optical connector 11 which are not subjected to transfer molding yet. FIG. 9 shows the optical module forming components which have been subjected to transfer molding. FIG. 10 shows a lead frame 47 which does not hold the optical connector 11 yet.

In this case, the optical module is formed as follows:

First, as shown in FIG. 8, an optically operating element 14 such as a laser diode or photo diode is fixedly connected to the optical connector 11, for instance, by welding, with the optical axis adjusted.

Next, the lead frame 47 is used. The lead frame 47, as shown in FIG. 10, includes: a plurality of lead parts 12a which are formed into lead pins 12 later; a frame part 15a supporting these lead parts 12a; a substrate forming part 16 supported by a few of the lead parts 12a; and a holding member forming part 43a which is formed into a holding member 43. The lead frame 47 may be formed by etching a thin plate of 42 alloy or copper about 0.25 mm in thickness or blanking its by the press. Alternatively, it may be formed as follows: The substrate forming part 16 and the holding member forming part 43a, and the remaining parts are formed separately. Thereafter, the substrate forming part 16 is welded to a few of the lead parts 12a, or the holding member forming part 43a is welded to the frame part 15a. The lead frame 47 may further include a holding member 32 as in the example shown in FIGS. 5-7, which is inserted into the ferrule insertion hole of the optical connector 11 as described later.

An insulating film layer of alumina or the like is formed on the surface of the substrate forming part 16, and an electrically conductive wiring pattern including bonding pads is formed on the insulating film layer. The wiring pattern is made of aluminum for instance. Electronic circuit elements such as bear chip ICs 17 are fixedly mounted on the substrate forming part 16, for instance, by die bonding, on which the wiring pattern has been formed as described above. As is apparent from the above description, the substrate forming part 16 serves as means for bearing the electronic circuit elements such as the bear chip ICs 17.

Figure 10:
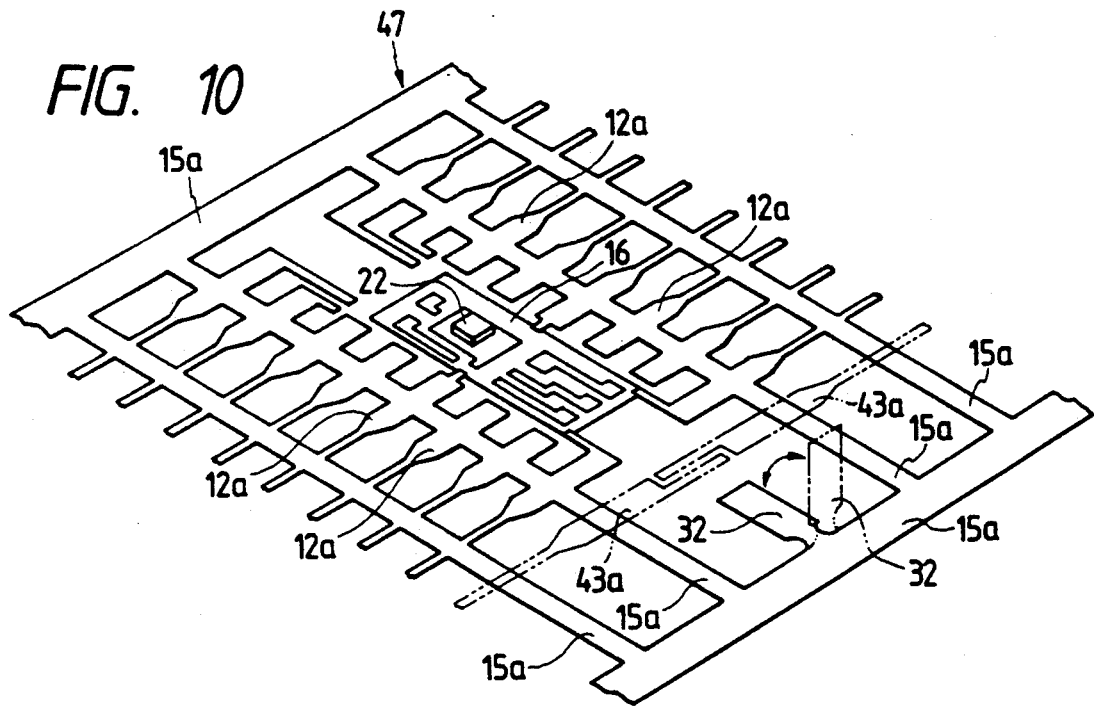
FIG. 10 is a perspective view showing the lead frame for the optical module shown in FIG. 8 in which its electronic circuit elements are installed on its substrate forming part.

After the electronic circuit elements have been mounted on the substrate forming part 16, the holding member 32 is bent as indicated by the two-dot chain line in FIG. 10. At the same time, the middle portion of the holding member forming part 43a is so shaped by the press or the like as to conform to the external form of the optical connector 11. In order to facilitate this shaping operation, it is preferable to divide the holding member forming part 43 into two parts as shown in FIG. 10. In the case where the holding member forming part 43a and the frame part 15a are formed separately, the middle portion of the holding member forming part 43 may be so shaped as to conform to the external form of the optical connector 11, before secured to the frame part 15a. In this case, it is unnecessary to divide the holding member forming part 43a into two parts.

The holding member 32 bent as shown in FIG. 10 is inserted into the ferrule insertion hole 11a of the optical connector 11, as shown in FIG. 8 or 9, to which the optically operating element 14 has been fixedly connected. Hence, the width of the holding member 32 is smaller than the diameter of the ferrule insertion hole 11a. Under this condition, the holding member 32 is bent back to the original position. Thus, the optical connector 11 is held by the holding member forming part 43a as shown in FIG. 8.

After the optical connector 11 has been held by the holding member forming part 43a in the above-described manner, the electronic circuit section formed on the substrate forming part 16 is connected to the lead parts 12a other than those supporting the substrate forming part 16 by wire bonding.

In addition, the electronic circuit section is further connected to the terminals of the optically operating element 14 with wires 18 as shown in FIG. 8.

The assembly of the lead frame 47, the optical connector, etc. is placed in a mold die (not shown) for transfer molding. Under this condition, resin is injected into the mold die to form a molded resin member 13 in such a manner that the latter holds those components as one unit as shown in FIG. 9.

As was described above, the optical connector 11 is supported by the holding member forming part 43a and the holding member 32 of the lead frame 47, which eliminates the difficulty that the optical connector 11 oscillates with respect to the lead frame 47 while the assembly of those components is being handled, for instance, moved to the mold die. That is, the wires 18 will not be broken nor disconnected which are connected between the bonding pads on the substrate forming part 16 and the terminals of the optically operating element 14 secured to the optical connector 11. This fact contributes not only to an improvement of the manufacturing efficiency, but also to an improvement of the reliability of the optical module.

After the above-described molding operation, the unnecessary parts of the lead frame 47 are cut off with the press. The remaining parts, namely, the lead parts and the holding member forming part are bent into the lead pins 12 and the holding member 43. Thus, the optical module has been manufactured as shown in FIG. 2.

Figure 11:
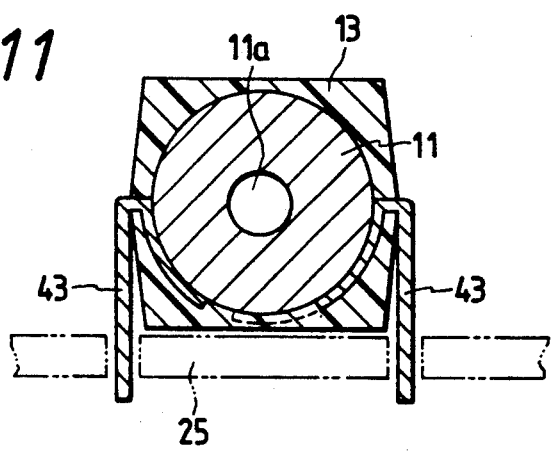
FIG. 11 is a sectional view of the optical module of FIG. 8, showing the vicinity of a holding member.

FIG. 11 is a sectional view showing the optical connector 11 held by the holding members 43. As shown in FIG. 11, in each of the holding members 43, at least its one end portion is held by the molded resin member 13, supporting the optical connector 11, and the other end portion, which is protruded from the molded resin member 13 is secured to a stationary member such as a printed circuit board 25 for instance, by soldering, similarly as in the case of the lead pins 12.

As was described above, the protruded portions of the holding members 43 are secured to the stationary member. Hence, when the end of the optical fiber is connected to or disconnected from the optical connector, stress or strain act on the lead pins and the holding members 43; however, its larger part acts on the holding members 43 which are closer to the optical connector 11. Thus, in this case, the stress or strain acting on the lead pins 12 is released more than in the case where no holding members 43 are provided. If the holding members 43 are not provided, then the stress or strain is applied collectively to the lead pin closest to the optical connector 11. Thus, the stress or strain is most significantly alleviated for the lead pin closest to the optical connector 11. The alleviation of the stress or strain prevents the oscillation of the lead pins when the optical fiber is connected to or disconnected from the optical connector. As a result, the difficulty is eliminated that the oscillation of the leads pins breaks or disconnects the wires which connect the lead pins to the electronic circuit section in the molded resin member. Thus, the optical module according to the invention is high in durability. In order to improve the durability of the optical module, it is preferable that the holding member 43 is inserted deep in the molded resin member. For this purpose, in the case where the holding member 43 is made up of two parts, it is preferable to cut the holding member 43 in the form of a crank at the middle as shown in FIG. 10.

Figure 12:
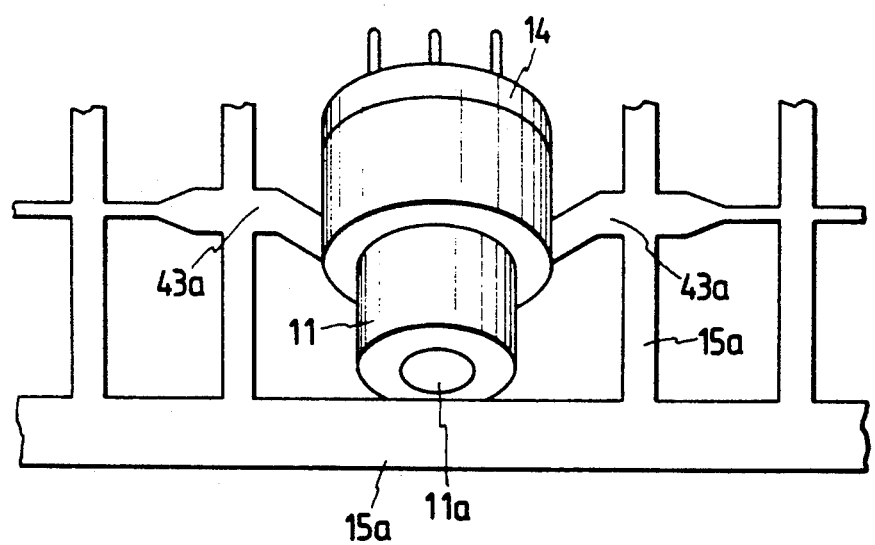
FIG. 12 is a perspective view showing another example of the member of the lead frame which supports the optical connector.

The middle portion of the holding member forming part 43a, which is a part of the lead frame 47, may be V-shaped as shown in FIG. 12.

In the embodiment shown in FIGS. 8 through 10, the lead frame includes both the holding members 32 and 43. However, the lead frame may so modified that the holding member 32 is removed from it. With the modification also, the wires are prevented from being damaged, and the optical module manufacturing efficiency is improved. In addition, the holding member 43 may be removed after the molding operation.

As is apparent from the above description, the optical module according to the invention is smaller in the number of component than a conventional optical module, and can be assembled more readily, and accordingly lower in manufacturing cost. All the components of the optical module are held as one unit by the molded resin member which is formed at low cost for instance by transfer molding. Thus, a number of optical modules can be molded at a time; that is, the optical module of the invention is suitable for production on a large scale. Summarized, a number of optical modules can be produced at low cost according to the invention.

During the manufacture, the optical connector is held with the holding member of the lead frame. Hence, the wires connected between the optically operating element secured to the optical connector and the electronic circuit section on the substrate are prevented from being damaged or disconnected during the manufacture. Thus, the optical module of the invention is high in manufacturing yield and high in reliability.

In the case where the outer portions of the holding member, which is protruded from the molded resin member, are secured to a stationary member such as a printed circuit board, stress or strain applied to the lead pins can be alleviated when the optical fiber is connected to or disconnected from the optical connector. That is, an optical module high in durability can be provided according to the invention.

We claim:

1. An optical module, comprising:
   an optical connector, to one end of which one end of an optical fiber is connected;
   an optically operating element secured to said optical connector, said optically operating element being optically coupled to said fiber;
   electronic circuit elements forming an electronic circuit connected to said optically operating element;
   a substrate bearing said electronic circuit elements;
   lead pins consisting of inner and outer leads, said inner leads being connected to electronic circuit; and
   a molded resin member holding as one unit said optical connector, said optically operating element, said electronic circuit elements, said substrate and said outer leads of said lead pins;
   wherein said molded resin member comprises a transfer molded resin member formed using a mold die into which said optical connector, said optically operating element and said electronic circuit elements connected to a lead frame are inserted.

2. An optical module as claimed in claim 1, wherein said lead frame includes said substrate and said lead pins.

3. A lead frame for an optical module manufactured by transfer molding an optical connector, an optically operating element, electronic elements and a substrate, comprising:
   a plurality of lead parts which are formed into lead pins of said optical module;
   a frame part for supporting said lead parts;
   a substrate forming part supported by a few of said lead parts; and a holding member for holding said optical connector.

4. A lead frame as claimed in claim 3, in which said holding member is integral with said lead frame.

5. A lead frame as claimed in claim 3, in which said holding member is in the form of a protrusion which is inserted into a ferrule insertion hole formed in said optical connector to support said optical connector.

6. A lead frame as claimed in claim 5, in which said holding member has a cut at a portion where said holding member is bent.

7. A lead frame as claimed in claim 5, in which said holding member is removed after transfer molding is carried out.

8. A lead frame as claimed in claim 3, in which said holding member is shaped to hold an outside of said optical connector.

9. A lead frame as claimed in claim 8, in which said holding member has a protrusion, said protrusion being secured to a stationary member after transfer molding is carried out.

10. A lead frame as claimed in claim 8, further comprising a holding member in the form of a protrusion which is inserted into a ferrule insertion hole of said optical connector.

11. A lead frame as claimed in claim 8, in which said holding member is removed after transfer molding is carried out.

* * * * *